(12) United States Patent
Kanbe et al.

(10) Patent No.: US 6,696,225 B1
(45) Date of Patent: Feb. 24, 2004

(54) SUBSTRATE AND MANUFACTURING METHOD THEREOF

(75) Inventors: Sadao Kanbe, Suwa (JP); Hitoshi Fukushima, Suwa (JP); Hiroshi Kiguchi, Suwa (JP); Syunichi Seki, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 09/356,395

(22) Filed: Jul. 16, 1999

(30) Foreign Application Priority Data

Jul. 16, 1998 (JP) .............................. 10-202343

(51) Int. Cl.⁷ .............................. G03F 7/42; B32B 3/00
(52) U.S. Cl. .................... 430/320; 430/329; 430/18; 347/105; 427/146; 428/195
(58) Field of Search .............................. 430/11, 320, 14, 430/18, 291, 329, 314; 347/105; 428/195; 427/146

(56) References Cited

U.S. PATENT DOCUMENTS

| | | | | |
|---|---|---|---|---|
| 4,328,263 A | * | 5/1982 | Kurahashi et al. | 430/314 |
| 5,543,266 A | * | 8/1996 | Noguchi et al. | 430/280.1 |
| 5,585,221 A | * | 12/1996 | Noguchi et al. | 430/280.1 |
| 6,045,215 A | * | 4/2000 | Coulman | 347/47 |
| 6,155,676 A | * | 12/2000 | Etheridge, III et al. | 347/63 |
| 6,228,475 B1 | * | 5/2001 | Chu et al. | 428/32.25 |
| 6,277,476 B1 | * | 8/2001 | Shaw-Klein et al. | 428/32.3 |

* cited by examiner

Primary Examiner—John S. Chu
(74) Attorney, Agent, or Firm—Harness, Dickey & Pierce, P.L.C.

(57) ABSTRACT

A method of manufacturing a substrate with a pattern showing hydrophilic property formed on a pattern surface comprising the steps of applying a silane coupling agent to the pattern surface of the base and forming a silane coupling film, forming a mask conforming to the pattern to be provided on the silane coupling film, and activating the silane coupling film provided with the mask by applying energy thereto in order to generate a polar group. In the regions where masking could not be performed, a polar group such as the hydroxyl group, carboxyl group, amino group, or amino carboxyl group is generated and shows hydrophilic property. The masked regions comprise hydrophobic property. This substrate functions as a universal substrate suitable for forming patterns with the inkjet system.

19 Claims, 5 Drawing Sheets

☐ HYDROPHOBIC REGION 10
▨ HYDROPHILIC REGION 11

SUBSTRATE AND MANUFACTURING METHOD THEREOF

BACKGROUND OF THE INVENTION

1. Field of the Invention

The present invention generally relates to the industrial application of inkjet-recording heads, and particularly relates to a substrate capable of forming an arbitrary pattern with an inkjet system and the manufacturing method of such substrate.

2. Description of the Related Art

A typical substrate used for semiconductor processes and soon is made from the likes of silicon. Conventionally, in order to manufacture an integrated circuit from such silicon substrate, methods such as photolithography were used. As described on pages 283 through 305 of the "Thin Film Handbook" compiled by the Japan Society for the Promotion of Science, for example, this photolithography is a method wherein sensitive material called a resist is applied thinly on to a silicon wafer, and the integrated circuit pattern prepared on a dry glass plate with photoengraving is transcribed by being printed with light. Ion and the like are driven into the transcribed pattern to form wiring patterns and elements.

To utilize the photolithography method, however, steps such as photoengraving, resist application, exposure, developing, etc. are necessary. Thus, the production of minute patterns is not possible without semiconductor factories equipped with large devices, power distribution equipment, exhaustion equipment and the like. Accordingly, it is standard knowledge that complex process management and large costs are required in order to form minute patterns.

If, for example, an ordered pattern of $\mu m$ could be produced easily and inexpensively without using equipment of factories and the like, industrially, an unlimited demand could be expected. Thus, by using the inkjet system which the applicant specializes in technically, the aforementioned problems may be overcome. In other words, the inkjet-recording head that discharges ink with the inkjet system is capable of discharging from a nozzle hole an arbitrary fluid body. As the resolution of this inkjet-recording head is minute, 400 bpi for example, forming an arbitrary pattern of an ordered width of $\mu m$ is possible by discharging a fluid body which can be used for industrial purposes from each of the nozzle holes.

The droplets discharged from the inkjet-recording head spread up to a certain area upon reaching the surface of the substrate where the pattern is to be formed (hereinafter "pattern surface") (the motion of a single droplet reaching the subject surface is hereinafter referred to as "adhering"). The spreading of the adhered droplet is determined by the amount and speed of the droplet, the contact angle of the pattern surface of the fluid body and such fluid body. As a requirement therefor, the adhered fluid body pattern should not overspread and should not be discontinuous or interrupted.

SUMMARY OF THE INVENTION

In order to satisfy such requirement, the inventors of the present invention devised a substrate suitable for forming patterns with the inkjet system capable of maintaining an appropriate spread of the pattern by using surface tension, as well as the manufacturing method of such substrate.

In other words, an object of the present invention is to provide a substrate capable of forming patterns having moderate spread and continuousness by the surface tension of the fluid body upon forming patterns with the inkjet system and the like.

Another object of the present invention is to provide a manufacturing method of a substrate capable of forming patterns having moderate spread and continuousness by the surface tension of the fluid body upon forming patterns with the inkjet system and the like.

The present invention is characterized in that the substrate comprises on the base a film having a pattern portion with affinity for the fluid body. One mode of the present invention is a substrate wherein a film is formed on the base such that the base will develop affinity for the fluid body, this film is refined, and the pattern of such affinity region is selectively formed on the substrate. Moreover, in another mode, it is possible to directly form on the base a film originally having an affinity region and a non-affinity region.

A further mode of the present invention is a substrate wherein a silane coupling film is formed on the base with a silane coupling agent, and the hydrophilic region patterned on the silane coupling film comprises a polar group such as the hydroxyl group, carboxyl group, amino group, or amino carboxyl group.

Minute patterns showing hydrophilic property are formed on the entire pattern surface of the substrate. By discharging droplets of a fluid body to the pattern surface of this substrate with the inkjet system and the like, surface tension will work on the adhered droplets per hydrophilic minute pattern and prevent overspreading. As the fluid body will spread well on a hydrophilic pattern, the pattern formed by the fluid body will not be interrupted if the hydrophilic pattern is formed continuously. The shape of the pattern may be changed variously: a series of squares, a series of circles, a series of parallel lines, etc.

Here, showing "hydrophilic property" shall mean that the adhesiveness to a fluid body comprising a polar group such as water is high (affinity). In other words, the contact angle against the fluid body is relatively small. Showing "hydrophobic property" shall mean that the adhesiveness to a fluid body comprising a polar group such as water is low (non-affinity). In other words, the contact angle against the fluid body is relatively large. Both expressions are used for the sake of convenience as a comparison to clarify the degree of affinity against the fluid body. "Fluid body" is not limited to ink, but may be any medium which may be used industrially and comprises a viscosity (several cp) capable of being discharged from the nozzle. That is, it does not matter whether it is hydrophilic or hydrophobic. Nor does it matter whether it is organic or inorganic. Moreover, a mixture may be mixed in the fluid body in a colloidal form.

The affinity region may be structured by a hydrophilic region being patterned on to a hydrophobic region, or a hydrophobic region being patterned on to a hydrophilic region.

Another mode of the present invention is a substrate comprising a hydrophilic film showing hydrophilic property formed with a prescribed pattern on a pattern surface showing hydrophobic property, wherein this hydrophilic film is composed of inorganic oxide such as silica or alumina.

The substrate showing the aforementioned hydrophobic property, for example, is formed from one among bakelite, polyester, polyethylene, tefron, PMMA, polypropylene, and chloroethylene.

The present invention is a substrate comprising a copolymer compound film composed of a monomer showing hydrophilic property and a monomer showing hydrophobic property. For example, the monomer showing hydrophilic property is ethylene and the monomer showing hydrophobic property is vinyl alcohol.

The present invention is a method of manufacturing a substrate with a pattern showing hydrophilic property formed on a pattern surface comprising the steps of (a) applying a silane coupling agent to the pattern surface of the base and forming a silane coupling film, (b) forming a mask conforming to the pattern to be provided on the silane coupling film, and (c) activating the silane coupling film provided with the mask by applying energy thereto in order to generate a polar group. In the activating step, for example, the silane coupling agent is activated by ultraviolet irradiation or corona discharge.

The present invention is a method of manufacturing a substrate with a pattern showing hydrophilic property formed on a pattern surface comprising the steps of forming an organic mask conforming to the pattern to be provided on the pattern surface, forming an in organic oxide film on the pattern surface provided with the in organic mask, and removing the organic mask on the pattern surface with the in organic oxide film formed thereon and simultaneously removing the in organic oxide film selectively.

The present invention is a method of manufacturing a substrate with a pattern showing hydrophobic property formed on a pattern surface comprising the steps of forming an organic mask conforming to the pattern to be provided on the pattern surface, forming an in organic oxide film on the pattern surface provided with the in organic mask, removing the organic mask on the pattern surface with the in organic oxide film formed thereon and simultaneously removing the in organic oxide film selectively, and processing the surface of the remaining in organic oxide film to be hydrophilic.

DESCRIPTION OF THE PREFERRED EMBODIMENTS

The preferred embodiments of the present invention are hereinafter explained with reference to the relevant drawings.

Embodiment 1

Embodiment 1 of the present invention pertains to a substrate using a silane coupling agent and the manufacturing method thereof.

Figure 1A:
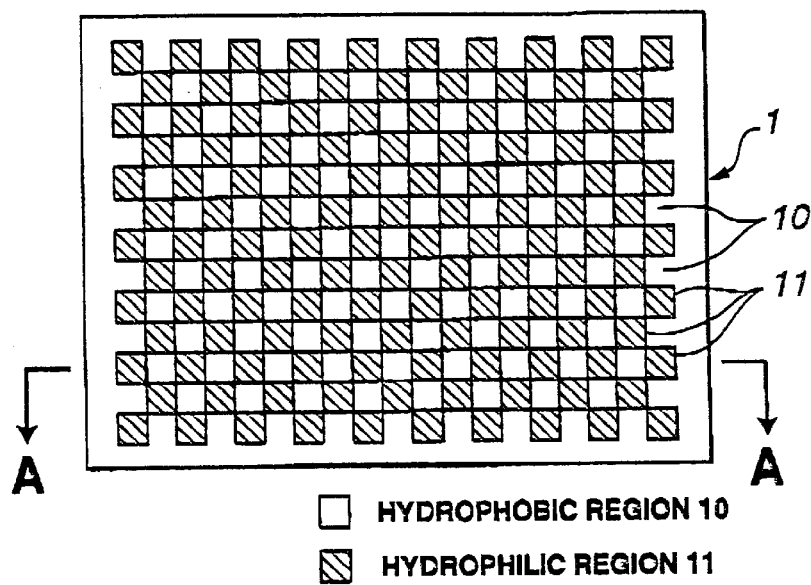
FIG. 1 is a diagram showing the outline of the substrate in Embodiment 1 and (a) is a plan view and (b) is a sectional view thereof.
Figure 1B:
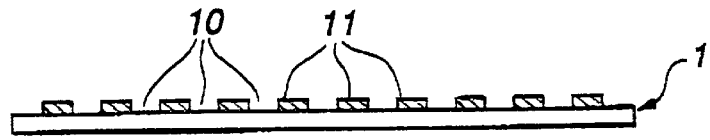

FIG. 1 is a diagram showing the outline of the substrate in Embodiment 1. FIG. 1(a) is a plan view of the substrate 1 seen from the pattern surface, and FIG. 1(b) is a side view of the substrate in FIG. 1(a) seen from section AA. The substrate 1a in Embodiment 1, as shown in FIGS. 1(a) and (b), comprises a hydrophobic region 10 showing hydrophobic property to a prescribed fluid body and a hydrophilic region 11 (shown in diagonal lines) showing hydrophilic property to a fluid body. Both the hydrophobic region 10 and hydrophilic region 11 are formed on the silane coupling film 101 formed on the pattern surface of the base 100 shown in FIG. 2. Nevertheless, the region in which a polar group is not formed on the surface by ultraviolet irradiation or corona discharge is the hydrophobic region 10 and the region in which a polar group is generated is the hydrophilic region 11. The hydrophilic region 11 is a region formed by patterning. The hydrophilic region 11 is patterned in squares. The hydrophilic regions are in mutual contact with each other at the apexes of the squares and are in an overall mosaic form.

The shape, size, and compression of each pattern may be adequately changed in accordance with the degree of the surface tension of the fluid body, for example, degree of the contact angle and size of the droplets. This pattern shape is not limited to squares, but may also be circles, ovals or other encircled curvatures, triangles or other polygons, or parallel lines. The mutual patterns may or may not be in contact with each other. In the hydrophilic region 11 with one fluid body adhered thereto, this pattern shape is patterned such that, when a fluid body is adhered to a hydrophilic region 11 adjacent to such fluid region, the fluid bodies adhered to each other will contact. If no fluid body is adhered to the adjacent hydrophilic region, this pattern shape is patterned such that the fluid body will not spread to the hydrophilic region by surface tension in which a fluid body is not adhered thereto exceeding the hydrophilic region 11.

It is preferable that the size of one pattern of the hydrophilic region is a size to the extent wherein the droplet of the fluid body discharged by the inkjet system leaks to the periphery thereof. If the size (width) of the pattern is too small in comparison to the droplet, the surface tension generated at the boundary of each hydrophilic region will be too weak to be able to prevent the spread of the droplet, and will be no different than when discharged on to an ordinary substrate. Contrarily, if the size of the pattern is too large in comparison to the droplet, the droplet will not reach the boundary of each hydrophilic region, and the outline may be deformed or the pattern may be divided into sections.

It is preferable that the arrangement of the patterns of the hydrophilic region is an arrangement wherein each of the mutual patterns is at a point contact. If each of the patterns contacts each other and becomes completely connected, the surface tension at the hydrophilic region boundary cannot be prevented, and unlimited droplets may seep into the adjacent hydrophilic region. Contrarily, if each of the patterns is too far apart, the continuousness of the droplets will be obstructed, and the droplet pattern may become separated.

Effect

Figure 3:
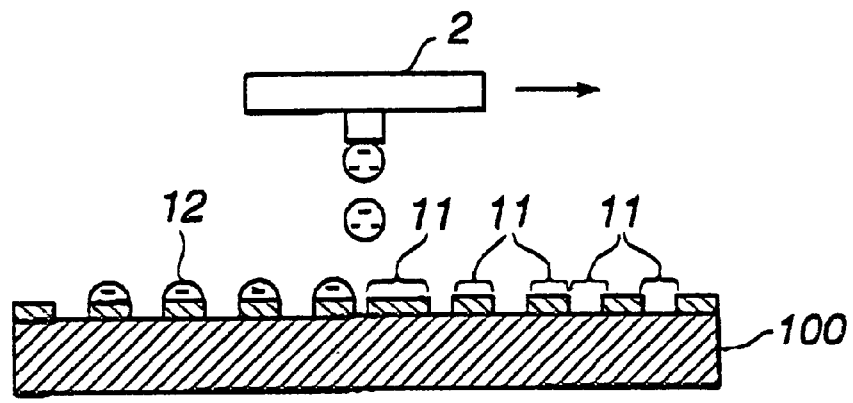
FIG. 3 is a section view of the substrate at the time of forming a pattern with the inkjet system.
Figure 4:
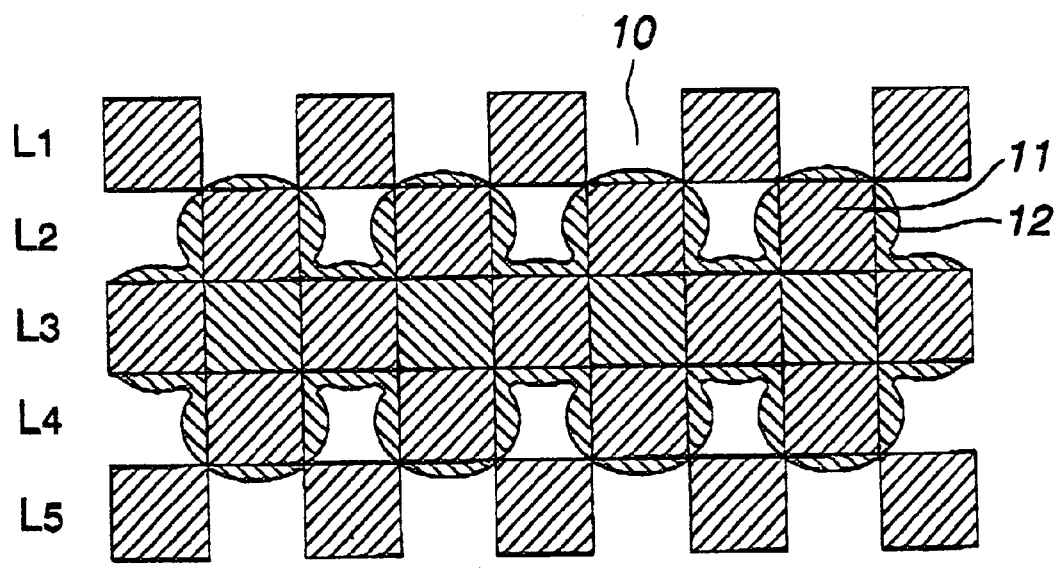
FIG. 4 is an explanatory diagram showing the degree of spreading upon the fluid body adhering to the substrate of the present invention.

FIG. 3 and FIG. 4 show the adhesion of the droplet upon discharging droplets (fluid body) from an inkjet-recording head 2 to the substrate in Embodiment 1.

The inkjet-recording head 2 is a head capable of discharging a fluid body with an on-demand type piezo-jet mechanism. Specifically, a flexible vibration plate is provided on one face of a pressure chamber substrate to which a pressure chamber (not shown) is formed, and the inkjet-recording head 2 is structured comprising a piezoelectric element showing an electromechanical transducer effect to this vibration plate. A nozzle plate providing a nozzle per pressure chamber is affixed to one face of the pressure chamber substrate. In this structure, the vibration plate bends when voltage is applied to the piezoelectric element, the pressure of the pressure chamber rises momentarily, and the fluid filled in the pressure chamber from the nozzle is discharged.

Upon using the substrate 1 of the present embodiment, if the droplet 12 of the fluid body discharged from the inkjet-recording head 2 is made from polar molecules, this fluid body will repel in the hydrophobic region 10 and adhere to the hydrophilic region 11. That is, the fluid body has wettability for the hydrophilic region. The droplet 12 of the fluid body discharged on to the base 100 spreads sufficiently in the hydrophobic region 11 as shown in FIG. 4. On the other hand, this droplet is excluded (repelled) in the hydrophobic region 10 and is drawn into the adjacent hydrophilic region 11 in accordance with the surface tension. After the surface tension works and the droplet is drawn in as shown in FIG. 4, the droplet 12 adheres to the center of the hydrophilic region 11.

Even if the discharge direction of the droplet from the head is slightly off position, if it adheres within a prescribed width from line L2 to L4, the adhered droplet 12 of the fluid body will always land on the hydrophilic region 11 between line L2 and L4. If no droplet 12 of the fluid body is on the hydrophobic region 10 adjacent to the hydrophilic region 11 with a droplet 12 of the fluid body thereon, the droplet 12 of the fluid body on the hydrophobic region 10 will not seep into the adjacent hydrophobic region 10 or a hydrophobic region 10 in the vicinity thereof due to surface tension. If a droplet 12 of the fluid body is on the hydrophobic region 10 adjacent to the hydrophilic region 11 with a droplet 12 of the fluid body thereon, the mutual regions are either in contact or are extremely close even if apart, and the droplets 12 will mutually connect by surface tension. Therefore, in the region where the droplet 12 is discharged, a continuous pattern with the connected droplets is formed. As the droplets are full at the hydrophilic region 11 with the droplet 12 thereon, this droplet will not separate from the adjacent droplet connected thereto even after this droplet dries.

According to the aforementioned substrate, the pattern will not spread or contract and be divided into sections upon drying when discharging droplets with the inkjet system. Thus, this substrate is suitable for forming patterns with the inkjet system.

Manufacturing Method

The manufacturing method of the substrate in Embodiment 1 is hereinafter explained with reference to FIG. 2.

Figure 2A:
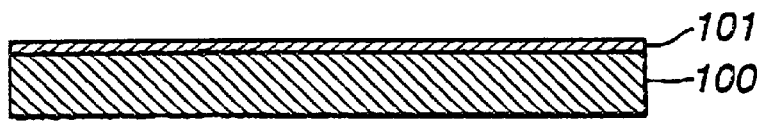
FIG. 2 is a manufacturing method of the substrate in Embodiment 1.

Silane Coupling Film Forming Step (FIG. 2(a)):

This is a step of forming a silane coupling film 101 by applying a silane coupling agent to the base 100. A silane coupling agent is, for example, an organic silicon compound having a functional group capable of chemically bonding in organic material such as glass, silica, metal, and clay with organic material such as macromolecules, which generally do not conform with each other.

If X is an easily hydrolyzed substitutional group such as an alkoxy group or halogen and Y is a vinyl group, epoxy group or amino group which easily reacts with an organic substance, the general formula of a silane coupling agent is represented by $Y\text{-}CH_2SiX_3$. This silane coupling agent shows hydrophobic property when surface refining processing is not performed thereto, but easily generates a polar group such as the hydroxyl group, carboxyl group, amino group, or amino carboxyl group by surface refining processing such as ultraviolet irradiation or corona discharge and becomes hydrophilic.

The base 100 needs only to possess a certain mechanical strength, but is preferable if it is made from material having strong adhesion to the silane coupling agent. Glass, metal, polyimide resin, polyester film and so on are used for example. For the application of the silane coupling agent, methods such as spin coating, roll coating, dye coating, spray coating, and other methods are employed. Any method may be employed so as long as the silane coupling agent is applied at a certain thickness. The thickness of the silane coupling film is formed to be approximately 2 nm~1 μm. After the film is formed, such film is dried with heat processing and the like.

Figure 2B:
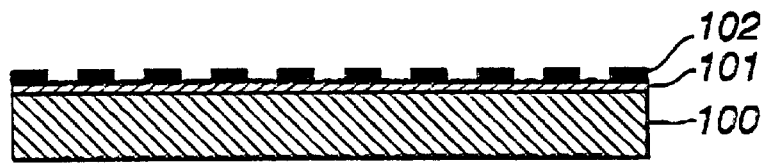

Mask Forming Step (FIGS. 2(b)):

This step forms a mask 102 on the silane coupling film 101. The mask 102 is formed in a pattern such that the hydrophobic region 10 is covered with the mask. As masking materials, various masks such as an exposure mask, emulsion mask, and hard mask may be formed. When using an exposure mask, chrome, chrome oxide, silicon, silicon oxide, and oxide films are formed with vacuum deposition, sputtering, or CVD method, etc.

Figure 2C:
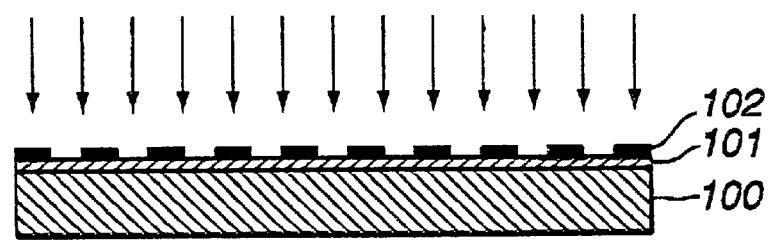

Surface Refining Step (FIG. 2(c)):

This step activates the surface molecules by applying energy to the silane coupling film 101 with the mask 102 formed thereon and generates a substitutional group such as a hydroxyl group by generating hydrolysis. Ultraviolet irradiation or corona discharge may be employed for this surface refining processing. Specifically, ultraviolet irradiation is performed by irradiating the entire surface through the mask using an ultraviolet lamp. Corona discharge is performed by applying voltage in pulses while activating the base with a corona discharge processing device having dotted electrodes in a single line in order to obtain a matrix design. By this refining processing, a non-reaction group is generated in the region where masking is not performed on the surface of the silane coupling film 101. When processing is conducted under atmospheric or oxygen atmosphere, the non-reaction group is replaced by a polar group such as a hydroxyl group.

Figure 2D:
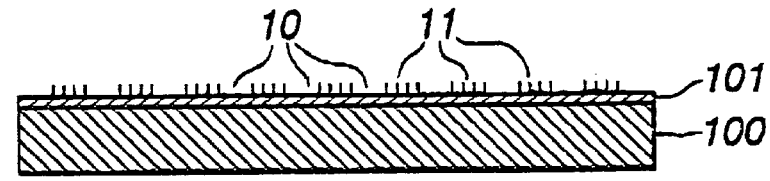

Mask Removal Step (FIG. 2(d)):

This step removes the mask 102. Removal of the mask 102 is conducted with a well-known organic solvent.

From the aforementioned manufacturing steps, the masked region of the silane coupling film 101 becomes the hydrophobic region 10 and the region not masked and replaced by a polar group becomes the hydrophilic region 11. Moreover, if the fluid discharged from the inkjet-recording head is not made from polar molecules, the adhesion with the hydrophobic region 10 will be strong and the adhesion with the hydrophilic region 11 will be weak.

According to the present embodiment, by applying and patterning a silane coupling agent and performing surface refining processing, provided is a substrate capable of forming patterns without the droplet pattern overspreading or being interrupted. Therefore, provided is a substrate suitable as a universal substrate for producing arbitrary patterns on a substrate with the inkjet system and the like.

Embodiment 2

Embodiment 2 of the present invention provides a substrate utilizing an in organic oxide and the manufacturing method thereof.

Explanations of the outline of the substrate and the hydrophilic region pattern of the present embodiment are omitted as they may be considered the same as Embodiment 1 above. The substrate in Embodiment 2, however, is composed of an exposure region and a region formed of an in organic oxide film. Whether it is hydrophilic or hydrophobic will change pursuant to the surface refining processing.

Next, the manufacturing method of the substrate according to Embodiment 2 is explained with reference to FIG. 5.

Figure 5A:
FIG. 5 is the manufacturing method of the substrate in Embodiment 2.

Mask Forming Step (FIG. 5(a)):

This step forms a mask 201 on a base 200. As the base 200, used are materials such as metal and heat-resistant resin that are not affected by heat processing and show differences in the hydrophilic property in the relation between an in organic oxide film.

The mask 201 is patterned such that it conforms to the hydrophilic and hydrophobic patterns on the base 200. Further, when the in organic oxide film 202 is not fluorinated, the in organic oxide film 202 forms the hydrophobic region 10 and the exposure region of the base 200 forms the hydrophilic region 11. When fluorinated, the in organic oxide film 202 forms the hydrophilic region 11 and the exposure region of the base 200 forms the hydrophobic region 10. It is preferable that the masking material be composed of an organic substance that evaporates and volatizes upon being heated. For example, camphor, naphthalene, etc. are used as the material. Various methods, such as printing, vacuum deposition, sputtering and CVD may be employed for forming the mask. Moreover, the various patterns described in Embodiment 1 may be employed as the mask pattern.

Figure 5B:
Figure 5C:
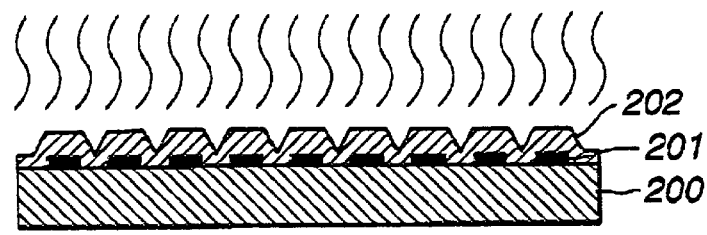
Figure 5D:

Inorganic Oxide Film Forming Step (FIG. 5(b)):

This step forms an in organic oxide film 202 on the pattern surface of the base 200 with the mask 201 formed thereon. As the in organic oxide, the likes of silica (silicon oxide), alumina (aluminum oxide), zeolite, calcium sulfate, and titanium oxide may be used. Various application methods such as spin coating, roll coating, dye coating, spray coating and so on may be employed for forming the in organic oxide film. Other methods may be employed so as long as the thickness of the in organic oxide film can be formed at a certain thickness. Moreover, the in organic substance film may be foremost formed and the surface thereof may be oxidized thereafter by heat processing and the like.

Removal Step (FIGS. 5 (c) (d))

This step removes the formed mask. Sublimation of the mask material is used in order to remove the mask, and by heating the base, the mask material is sublimated and removed. By removing the mask 201, the masked region of the base 200 is exposed. If the surface is not fluorinated, the exposed portion of the base 200 becomes the hydrophilic region 11 and the portion not masked with the in organic oxide film 202 remaining becomes the hydrophobic region 10.

Furthermore, by placing this substrate under a fluorine gas atmosphere, it is possible to fluorinate the in organic oxide film 202. By this processing, the exposed portion of the base 200 becomes the hydrophobic region 10 and the portion not masked with the in organic oxide film 202 remaining becomes the hydrophilic region 11. Fluorination is conducted by performing plasma processing under an atmosphere with fluorine gas such as $CF_4$ flowing therein.

According to Embodiment 2, by applying and pattering an in organic oxide, provided is a substrate capable of forming patterns without the droplet pattern overspreading or being interrupted. Therefore, provided is a substrate suitable as a universal substrate for producing arbitrary patterns on a substrate with the inkjet system and the like. In the present embodiment, particularly, the hydrophilic region and hydrophobic region may be inverted by performing or not performing surface processing.

Embodiment 3

Embodiment 3 of the present invention relates to the method of manufacturing a substrate explained in Embodiment 1 above using a copolymer compound.

In the present embodiment, a copolymer compound film is formed on the base surface. A copolymer compound is a compound using two or more types of monomers and includes such monomers in its composition. In the least, the present embodiment selects one of the monomers as a material showing hydrophilic property and selects the other monomer as a material showing hydrophobic property. This copolymer compound comprises a lamella structure wherein the plurality of monomers are in units of blocks with one or more molecules. A lamella structure is, for example, a structure wherein laminar block units are gathered in accordance with a certain rule. The molecules composing the block units may have hydrophilic property or hydrophobic property. Thus, if this copolymer compound is arranged on the entire surface of the base and fixed thereto, the substrate will be of the structure of the present invention wherein the hydrophilic region and the hydrophobic region are arranged minutely. In the present embodiment, particularly, used is a copolymer compound composed of ethylene-vinyl alcohol using ethylene as the material showing hydrophobic property and vinyl alcohol as the material showing hydrophilic property.

Next, the method of manufacturing the substrate in Embodiment 3 is explained with reference to FIG. 6.

Figure 6A:
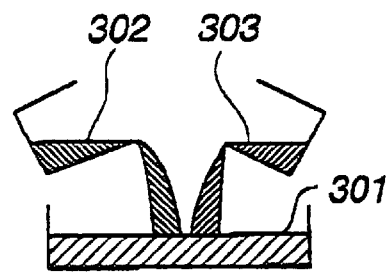
FIG. 6 is the manufacturing method of the substrate in Embodiment 3.

Copolymer Compound Mixing Step (FIG. 6(a)):

Foremost, ethylene which is a monomer showing hydrophobic property is polymerized by ionic polymerization to obtain an appropriate molecule weight of the hydrophobic macromolecule 302. This hydrophobic macromolecule 302 is added to the vinyl alcohol which is a monomer showing hydrophilic property and then polymerized to obtain the copolymer-compound 301 composed of a hydrophilic portion and a hydrophobic portion. As a catalyst, butyl lithium or sodium naphthalene may be used. THF is used as the solvent.

Figure 6B:
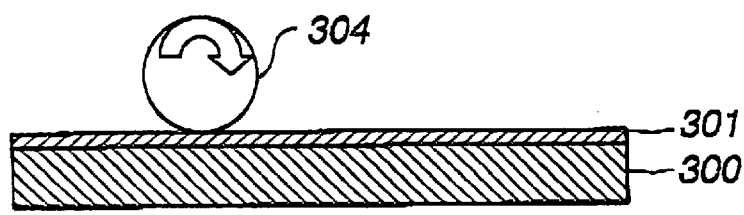

Application Step (FIG. 6(b)):

This step applies a solution 301 of the copolymer compound obtained with the aforementioned steps on to the base 300 for forming a copolymer compound film 301. As the method of applying the solution 301 of the copolymer compound, a roll coating method with a roller or a casting method may be employed therefor. By leaving alone the copolymer compound 301 to which the application step has been performed, the solution is removed and the copolymer compound becomes dry. As the base 300 never directly contacts the fluid body discharged with the inkjet system, whether the composition of the base is hydrophilic or hydrophobic is irrelevant, and any arbitrary material may be employed therefor so as long as it possesses a certain mechanical strength.

For the manufacture of copolymer compounds, macromolecule thin film growth, in other words plasma polymerization may be used. Plasma polymerization uses a mixed gas of a monomer gas comprising hydrophilic property and a monomer gas comprising hydrophobic property. This mixed gas is activated by glow discharge and generates the polymer film thereof on the base 100. The plasma polymerization device is used for generating the copolymer compound film. As a condition for plasma polymerization, the gas flow weight, gas pressure, discharge frequency, and the discharge voltage are set to conform to this mixed gas.

Figure 6C:
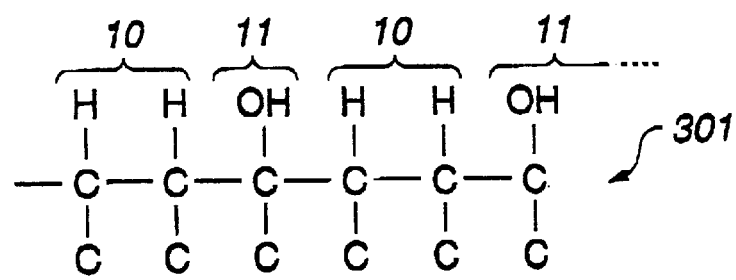

The copolymer compound 301 formed in the steps above have a polymeric structure as shown in FIG. 6(c). The hydroxyl group portion of the vinyl alcohol shows hydrophilic property and becomes the hydrophilic region 11. Contrarily, the ethylene molecule region shows hydrophobic property and becomes the hydrophobic region 10.

According to Embodiment 3, as a copolymer compound was used, the substrate of the present invention maybe manufactured by a lamella structure in the size of minute molecules. This substrate is capable of arranging at random the affinity region and the non-affinity region merely by the generation and application of a copolymer compound. Thus, the manufacturing steps are simplified and the costs necessary therefor are reduced.

According to the present invention, as a silane coupling agent was used, it is possible to manufacture a substrate capable of forming patterns with appropriate spreading and continuousness by the surface tension of the fluid body upon patterning with the inkjet system and the like.

According to the present invention, as an organic oxide was used, it is possible to manufacture a substrate capable of forming patterns with appropriate spreading and continuousness by the surface tension of the fluid body upon pattering with the inkjet system and the like.

According to the present invention, as a copolymer of ethylene and vinyl alcohol was used, it is possible to manufacture a substrate capable of forming patterns with appropriate spreading and continuousness by the surface tension of the fluid body upon pattering with the inkjet system and the like.

What is claimed is:

1. A method of manufacturing a substrate with a pattern showing a hydrophilic property formed on a surface to be patterned, comprising the steps of:
   applying a silane coupling agent to the surface to be patterned so as to form a silane coupling film;
   forming a mask conforming to said pattern to be provided on said silane coupling film; and
   activating the silane coupling film provided with said mask by applying energy to said silane coupling film in order to generate a polar group so that the pattern showing the hydrophilic property is formed on the substrate.

2. A method of manufacturing a substrate according to claim 1, wherein said silane coupling agent is activated by ultraviolet irradiation or corona discharge in said activating step.

3. A method of manufacturing a substrate with a pattern showing a hydrophilic property formed on a surface to be patterned, comprising the steps of:
   forming an organic mask conforming to said pattern to be provided on said surface to be patterned;
   forming an in organic oxide film on the surface to be patterned provided with said organic mask; and
   removing said organic mask on the surface to be patterned with said in organic oxide film formed thereon and simultaneously selectively removing the in organic oxide film so that the pattern is formed on the substrate and wherein said organic mask is removed by heating.

4. A method of manufacturing a substrate with a pattern showing a hydrophobic property formed on a surface to be patterned comprising the steps of:
   forming an organic mask conforming to said pattern to be provided on said surface to be patterned;
   forming an in organic oxide film on the surface to be patterned provided with said organic mask;
   removing said organic mask on the surface to be patterned with said in organic oxide film formed thereon and simultaneously selectively removing the in organic oxide film; and
   processing the surface of the remaining in organic oxide film to be hydrophilic so that the pattern is formed on the substrate.

5. A method comprising:
   providing a substrate;
   forming a silane coupling film on said substrate;
   forming a mask on said silane coupling film; and
   activating said silane coupling film by applying energy to generate a polar group so that a pattern showing a hydrophilic property is formed on said substrate.

6. The method of claim 5 wherein said substrate further comprises one of glass, metal, polyimide resin, and polyester film.

7. The method of claim 5 wherein said silane coupling film further comprises an organic silicon compound.

8. The method of claim 5 wherein said silane coupling film is applied by one of spin coating, roll coating, dye coating and spray coating.

9. The method of claim 5 wherein said silane coupling film is about 2 nm to 1 $\mu$m thick.

10. The method of claim 5 wherein said activating step further comprises one of ultraviolet irradiation and corona discharge.

11. A method comprising:
    providing a substrate;
    forming an organic mask on said substrate;
    forming an in organic oxide film on said substrate and said organic mask;
    selectively removing portions of said in organic oxide film while simultaneously removing said organic mask; and
    processing the remaining in organic oxide film to be hydrophilic so as to form a pattern showing a hydrophilic property on said substrate.

12. The method of claim 11 wherein said substrate further comprises one of metal and heat-resistant resin.

13. The method of claim 11 wherein said organic mask further comprises one of camphor and naphthalene.

14. The method of claim 11 wherein said in organic mask further comprises one of silicia, alumina, zeolite, calcium sulfate, and titanium oxide.

15. The method of claim 11 wherein said organic mask is removed by sublimation.

16. A method of manufacturing a substrate with a pattern showing a hydrophilic property formed on a surface to be patterned, comprising the steps of:
    applying a silane coupling agent to the surface to be patterned so as to form a silane coupling film; and
    activating the silane coupling film by selectively applying energy in order to generate a polar group so that the pattern is formed on the substrate.

17. The method of claim 4, wherein processing the surface of the remaining in organic oxide film to be hydrophilic includes fluorinating said remaining in organic oxide film.

18. The method of claim 11, wherein processing the surface of the remaining in organic oxide film to be hydrophilic includes fluorinating said remaining in organic oxide film.

19. The method of claim 3, wherein said organic mask is removed by sublimation.

* * * * *

UNITED STATES PATENT AND TRADEMARK OFFICE
CERTIFICATE OF CORRECTION

PATENT NO. : 6,696,225 B1
DATED : June 5, 2004
INVENTOR(S) : Sadao Kanbe et al.

It is certified that error appears in the above-identified patent and that said Letters Patent is hereby corrected as shown below:

Column 1,
Line 15, "soon" should be -- so on --.

Column 3,
Lines 20, 21, 23, 24, 29, 30, 31, 33 and 34, "in organic" should be -- inorganic --.

Column 5,
Lines 53-54, "in organic" should be -- inorganic --.

Column 6,
Line 13, "FIGS." should be -- FIG. --.
Line 61, "in organic" should be -- inorganic --.

Column 7,
Lines 1, 10-11, 14, 15, 17-18, 29, 31, 35, 37, 38, 48, 52, 55 and 60, "in organic" should be -- inorganic --.

Column 9,
Lines 18, 52, 55, 56, 64 and 67, "in organic" should be -- inorganic --.

Column 10,
Lines 1, 3, 31, 33, 36, 44, 58, 59, 61 and 62, "in organic" should be -- inorganic --.

Signed and Sealed this

Eighth Day of November, 2005

JON W. DUDAS
*Director of the United States Patent and Trademark Office*